(12) United States Patent
Gupta et al.

(10) Patent No.: US 10,751,658 B2
(45) Date of Patent: Aug. 25, 2020

(54) EXTERNAL RACK MOUNTED FILTER FOR NETWORK DEVICE

(71) Applicant: CISCO TECHNOLOGY, INC., San Jose, CA (US)

(72) Inventors: Rohit Dev Gupta, Bangalore (IN); Shailesh R. Nayak, Bangalore (IN); Arjun Jayaprakash, Bengaluru (IN)

(73) Assignee: CISCO TECHNOLOGY, INC., San Jose, CA (US)

( * ) Notice: Subject to any disclaimer, the term of this patent is extended or adjusted under 35 U.S.C. 154(b) by 253 days.

(21) Appl. No.: 15/945,399

(22) Filed: Apr. 4, 2018

(65) Prior Publication Data
US 2019/0308121 A1    Oct. 10, 2019

(51) Int. Cl.
| | |
|---|---|
| *B01D 53/26* | (2006.01) |
| *B01D 46/00* | (2006.01) |
| *H05K 7/20* | (2006.01) |
| *H05K 7/18* | (2006.01) |
| *H05K 7/14* | (2006.01) |

(52) U.S. Cl.
CPC ..... *B01D 46/0005* (2013.01); *B01D 46/0027* (2013.01); *B01D 53/26* (2013.01); *H05K 7/1489* (2013.01); *H05K 7/186* (2013.01); *H05K 7/20181* (2013.01); *H05K 7/20736* (2013.01); *B01D 2265/06* (2013.01); *B01D 2279/45* (2013.01)

(58) Field of Classification Search
CPC ............... B01D 53/26; B01D 46/0027; B01D 2279/45; B01D 2265/06; H05K 7/20181; H05K 7/186; H05K 7/1489; H05K 7/20736

USPC ... 55/385.1, 385.6, 423, 479, 482, 483, 493, 55/524; 361/687, 727, 801, 812, 818, 361/831, 690–697; 454/184, 185, 187; 210/488, 489, 498; 174/35 R, 35 MS, 174/35 GC, 50; 312/223.2, 223.3
See application file for complete search history.

(56) References Cited

U.S. PATENT DOCUMENTS

| | | | | |
|---|---|---|---|---|
| 6,007,169 A | * | 12/1999 | Li | H05K 7/20181 312/223.2 |
| 7,431,408 B2 | * | 10/2008 | Lai | G06F 1/181 312/223.1 |
| 7,499,275 B2 | * | 3/2009 | Lai | H05K 7/20181 361/690 |
| 7,804,690 B2 | * | 9/2010 | Huang | H05K 7/20736 312/223.2 |
| 8,009,430 B2 | * | 8/2011 | Claassen | H05K 7/20736 361/724 |
| 8,081,459 B2 | * | 12/2011 | Doll | H05K 7/20736 361/679.47 |
| 9,552,715 B2 | | 1/2017 | Breslin | |

(Continued)

FOREIGN PATENT DOCUMENTS

| | | |
|---|---|---|
| EP | 2068608 A1 | 6/2009 |
| WO | 2017182857 A1 | 10/2017 |

*Primary Examiner* — Minh Chau T Pham
(74) *Attorney, Agent, or Firm* — Cindy Kaplan

(57) ABSTRACT

In one embodiment, an apparatus includes a frame for mounting in a rack in a position adjacent and external to a network device supported by the rack and a filter module for holding a filter for filtering air entering an air inlet of the network device. The frame includes an opening for receiving the filter module and positions the filter adjacent to the air inlet of the network device when installed on the rack.

20 Claims, 15 Drawing Sheets

(56) References Cited

U.S. PATENT DOCUMENTS

| | | |
|---|---|---|
| 9,707,501 B2 | 7/2017 | Twiss |
| 9,936,612 B2 | 4/2018 | Goulden et al. |
| 2008/0236393 A1* | 10/2008 | Heller ................ B01D 46/0005 95/273 |
| 2010/0037574 A1* | 2/2010 | Weber ................ B01D 46/0005 55/496 |
| 2017/0182450 A1* | 6/2017 | Kitaguchi .......... B01D 46/4227 |
| 2019/0111375 A1* | 4/2019 | Chen ........................ B04C 9/00 |

* cited by examiner

US 10,751,658 B2

EXTERNAL RACK MOUNTED FILTER FOR NETWORK DEVICE

TECHNICAL FIELD

The present disclosure relates generally to air filtration, and more particularly, to air filtration for network devices.

BACKGROUND

Network communications systems utilize network devices that include complex and sensitive electronic components. The network devices are typically designed to operate in a controlled environment such as data centers and central offices with controlled temperature, humidity, and air quality. However, with pervasive use of the Internet in mobility, smart grid, and IoT (Internet of Things) applications, network equipment is being deployed closer to a user base and deployments are often exposed to non-protected outdoor environments.

BRIEF DESCRIPTION OF THE DRAWINGS

Corresponding reference characters indicate corresponding parts throughout the several views of the drawings.

DESCRIPTION OF EXAMPLE EMBODIMENTS

Overview

Figure 1:
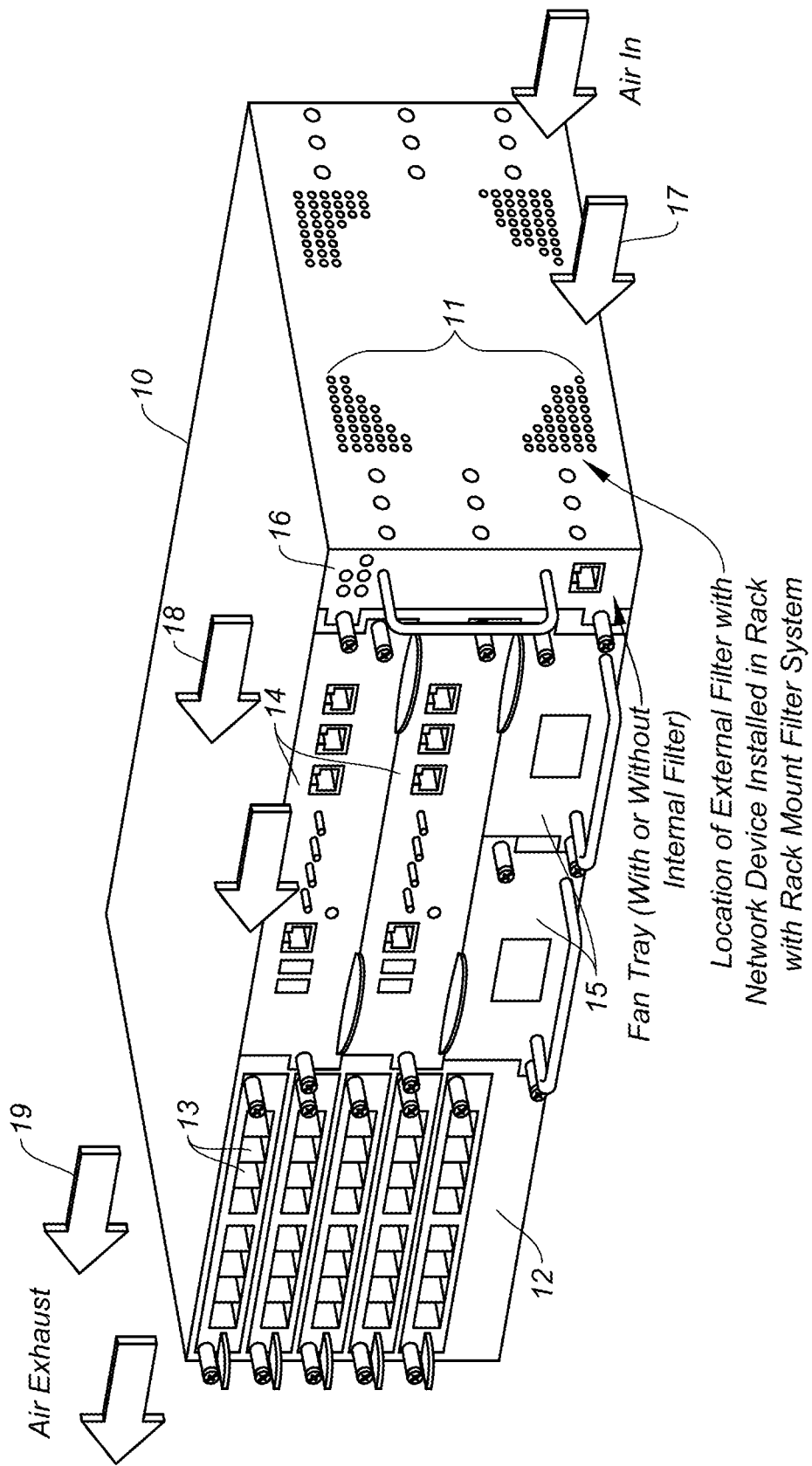
FIG. 1 illustrates airflow through a network device.

In one embodiment, an apparatus generally comprises a frame for mounting in a rack in a position adjacent and external to a network device supported by the rack and a filter module for holding a filter for filtering air entering an air inlet of the network device. The frame comprises an opening for receiving the filter module and positions the filter adjacent to the air inlet of the network device when installed on the rack.

In another embodiment, an apparatus generally comprises a frame for mounting in a rack in a position adjacent and external to a network device supported by the rack, the frame comprising a first portion for connecting to the rack and a second portion extending from the first portion and positioned adjacent to an air inlet of the network device when the frame is installed in the rack with the network device. The apparatus further comprises a filter module for holding a filter for filtering air entering the air inlet of the network device. The first portion of the frame comprises an opening for receiving the filter module and the second portion of the frame positions the filter adjacent to the air inlet of the network device when the frame is installed in the rack with the network device.

In yet another embodiment, an apparatus generally comprises a frame comprising mounting brackets for mounting the frame on rack posts of a rack system supporting a network device comprising an air inlet and a fan for cooling internal components of the network device. The apparatus further comprises a filter for filtering air at the air inlet of the network device. The frame comprises an opening for receiving the filter and positions the filter externally adjacent to the air inlet of the network device when mounted on the rack system.

Example Embodiments

The following description is presented to enable one of ordinary skill in the art to make and use the embodiments. Descriptions of specific embodiments and applications are provided only as examples, and various modifications will be readily apparent to those skilled in the art. The general principles described herein may be applied to other applications without departing from the scope of the embodiments. Thus, the embodiments are not to be limited to those shown, but are to be accorded the widest scope consistent with the principles and features described herein. For purpose of clarity, details relating to technical material that is known in the technical fields related to the embodiments have not been described in detail.

Network communications devices are increasingly being used in uncontrolled environments. For example many service provider access products are used as mobile back-haul or cell-cite routers, which results in deployment closer to communications towers. These deployment locations have different environmental conditions than a data center or central office. In most of these installations, the enclosure or cabinet used to contain the network device has no environmental protection and the network device is directly exposed to ambient air. Based on the climatic conditions of the area, the ambient air may not only carry a lot of dust and moisture, but also different chemical compounds. In an air cooled network device, the composition of the air may react with metal used in electronic components and cause corrosion. Deployment of network devices in the presence of uncontrolled contamination in cooling air (e.g., dust, moisture, abrasive chemicals), may lead to damage to electronic components, cooling fans, and mechanical enclosures. For example, chemical contamination may cause oxides to form over circuit board components and moisture may condense around the circuit board, resulting in fungus formation, arcing, shorting, dust deposition, or corrosion of components. Failure of the network device or components may occur very quickly in an uncontrolled environment. Although all types of outdoor equipment face these issues, the severity of the failure is typically higher for air cooled products due to the flow of contaminated air within product enclosures. Since these failures are often not recoverable, the downtime associated with these failures may be significant.

The above described failures may occur even if an internal dust filter is used in the network device, since the internal filter would not prevent chemical substances from entering the device or filter out moisture or a large amount of dust particles. The limited space available in network devices typically does not allow for a larger filter, which would consume significant space needed for electronics. The space limitations within a network device thus prevent the use of an internal filtration system that would filter out contaminants present in outdoor or uncontrolled environments.

The embodiments described herein comprise an external rack mount filter system that allows a fan cooled network device to operate in an uncontrolled environment without exposure of internal components of the network device to environmental contaminants. As described in detail below, the rack mount filter system may be installed in a rack system (rack, rack posts, rack assembly) along with the network device. In one or more embodiments, the rack mount filter system comprises a frame and a filter module supporting a high performance filtration media positioned to cover an air inlet region of the network device, thereby protecting internal components of the network device from exposure to dust, moisture, and chemical contamination. The rack mount filter system may be used with any type of rack mounted network device (electronic device, electronic component) to protect it from failure due to dust, moisture, chemical particles or any other airborne particles or harmful contamination.

The filtration media may be configured for filtering dust, moisture, chemical particles, or any combination of these or other contaminants present in the air, and may comprise different types, shapes, or widths of material depending on the filtration needed for a particular environment and the space available in the rack system with the network device installed. The filtration media may comprise, for example, a hydrophobic filter to address moisture. The embodiments provide improved reliability by avoiding corrosive failures of electronic components (electronic circuits, circuit boards, chips, wiring, memory, processors, line cards, fabric cards), mechanical components (fans, power units, interfaces, connectors), or any other internal components.

As described below, the rack mount filter system makes optimum use of rack space and utilizes space available between the network device and the rack. In one or more embodiments, the rack mount filter system may be installed as a kit, independent from the rack or the network device and may be fully modular and adjustable for use in a variety of different rack configurations. One or more embodiments may also help in cable management by avoiding interference with field replaceable modules, as described below.

Referring now to the drawings, and first to FIG. 1, an example of a network device 10 that may utilize the rack mount filter system to protect the network device from contamination is shown. In one or more embodiments, the network device operates in a data communications network including multiple network devices. The network device 10 may comprise, for example, a router, switch, server, or other network device, which may communicate over one or more networks (e.g., local area network (LAN), metropolitan area network (MAN), wide area network (WAN), virtual private network (VPN) (e.g., Ethernet virtual private network (EVPN), layer 2 virtual private network (L2VPN)), virtual local area network (VLAN), wireless network, enterprise network, corporate network, data center, Internet, intranet, radio access network, public switched network, or any other network).

In one embodiment, the network device 10 is a programmable machine that may be implemented in hardware, software, or any combination thereof. The network device 10 may include one or more processor, memory, and network interfaces. Memory may be a volatile memory or non-volatile storage, which stores various applications, operating systems, modules, and data for execution and use by the processor. The network interfaces may comprise any number of interfaces (e.g., line cards, ports) for receiving data or transmitting data to other devices.

In the example shown in FIG. 1, the network device 10 comprises a modular electronic system including an interface module 12 comprising a plurality of ports 13, two line cards (e.g., RSP (Router Switch Processor) units) 14, redundant power units 15, and a fan tray 16. The network device 10 may include any number of air passage openings 11 formed in opposite ends of the device to allow the flow of air through the network device. Arrows 17 indicate air entering the network device 10 at openings 11 (air inlet), arrows 18 indicate air flow through the device, and arrows 19 indicate air exhaust from the device (air outlet). The fan tray 16 includes a fan for pulling air into the network device 10 (or through the network device if located at the air outlet side). The fan tray 16 may include an internal air filter (not shown) configured for indoor applications (e.g., filtering dust present in typical indoor environments), which does not protect the network device from high levels of dust, moisture, or chemicals present in outdoor or factory environments.

As described in detail below, an external filter of the rack mount filter system is positioned adjacent to the air inlet (openings 11) of the network device 10 to filter the air circulated through the device by the fan located in fan tray 16 and protect internal components of the device from chemical corrosion or damage from moisture, dust, or any other contaminants. The external filter in the rack mount filter system may comprise a high performance air and chemical filter, which may be much thicker than the conventional internal air filter included in the fan tray 16, due to special coatings needed to trap and filter the contaminants, and would not fit internally within the network device. In one or more embodiments, the internal filter may be removed from the fan tray 16 to reduce the pressure drop through the network device 10, since there may not be a need for additional filtering beyond the external filter of the rack mount filter system. This allows for provisioning of a high performance fan in the space provided by eliminating the internal air filter. With a higher performance fan, a higher operating temperature may be supported, or a high power line card may be cooled, thereby providing additional system functionality. The external filter of the rack mount filter system may perform the function of the removed internal air filter along with filtering out additional contaminants.

It is to be understood that the network device 10 shown in FIG. 1 and described above is only an example, and that the network device may comprise any number or type of modules, including, for example, fabric cards, line cards, service cards, combo cards, controller cards, processor cards, high density line cards, high power line cards, fan trays, interface modules, or power units. The arrangement of components may also be different than shown. For example, the fan may be located on the exhaust side of the network device for pulling air through the device. The rack mount filter system described herein may be used to protect any type of air cooled electronic device from contaminants. Thus, the term network device as used herein may refer to any electronic device or component in which the rack mount filter system may be used to filter air entering the device and prevent damage from contaminants present in the air.

The network device 10 may be installed, for example, in a rack system located in an outdoor cabinet, ground based mast, or any other environment with exposure to contaminants beyond those typically present in indoor locations (e.g., data center, central office). As described in detail below, the network device 10 may be installed in a rack system comprising parallel rack posts (mounting brackets) configured to support a plurality of network devices. In one or more embodiments, the rack mount filter system may be mounted adjacent to the existing network device on the same rack posts with no changes to the network device or rack system. One or more embodiments leverage space behind the rack post (behind a mounting bracket of the rack post) and space between the network device and the rack post or between adjacent network devices for installation of the rack mount filter system.

Figure 2:
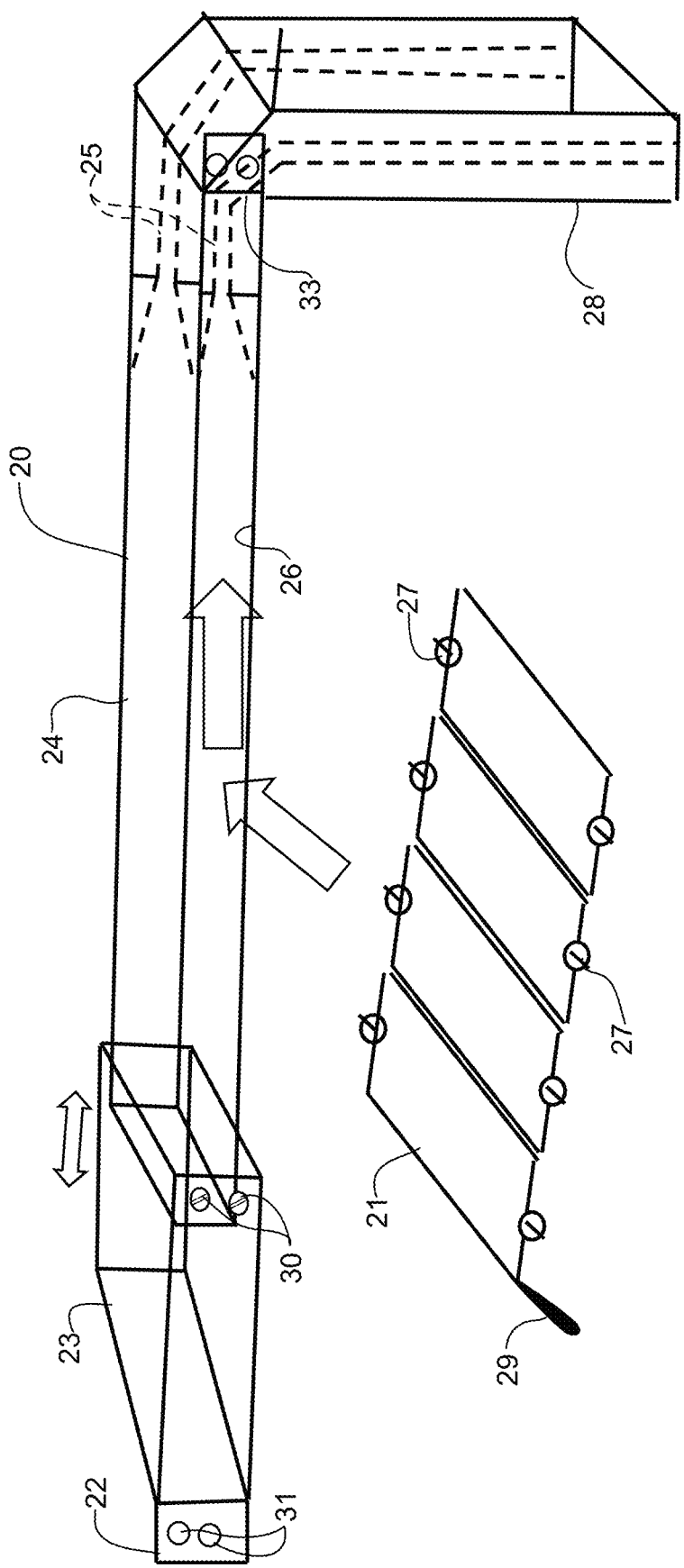
FIG. 2 is a wire frame drawing of a rack mount filter system, in accordance with one embodiment.

FIG. 2 is a wire frame representation of the rack mount filter system, in accordance with one embodiment. The system comprises a frame 20 for mounting in the rack system in a position adjacent and external to the network device supported by the rack system and a filter module for holding a filter for filtering air entering the air inlet of the network device. In one or more embodiments, the frame 20 comprises a first portion for connecting to the rack and a second portion extending from the first portion and positioned adjacent to the air inlet of the network device (indicated by arrows 17 in FIG. 1) when the frame is installed in the rack with the network device. As described below, the frame 20 is positioned adjacent (i.e., near an external wall (e.g., side, top) of the network device housing) and external to the network device. In one embodiment, the first portion is located above the network device and the second portion is positioned next to the network device.

In the example shown in FIG. 2, the first portion comprises an adjustable central (horizontal) section 24 with a first end slidably receivable in a mounting section 23 and a second end connected to the second portion. The first and second portions may be integrally formed or connected by suitable means. The second portion comprises a filter retaining (supporting) member 28 extending generally perpendicular from the first portion (vertically downward as shown in FIG. 2). The height and width of the filter retaining member 28 may be designed to fit within the rack and accommodate a suitable sized filter that sufficiently covers the air inlet of the network device.

The central section 24 includes a front facing opening 26 (as viewed from a front of the rack) for receiving filter module 21. As described below, the opening 26 is located adjacent to a front face of the network device so that it is easily accessible when the rack mount system is installed on the rack. The filter module 21 is inserted into the opening 26, as indicated by the arrows in FIG. 2, and moved longitudinally (horizontally) toward the filter retaining member 28 and into its operating position in the filter retaining member (to the right and downward as viewed in FIG. 2).

In one or more embodiments, the filter module 21 comprises a reusable filter frame for retaining a replaceable filtration media. The filter module 21 may include a handle 29 for ease of insertion of the filter module into the opening 26 and manipulation of the filter module once inserted into the frame 20 to move the filter to its operating position within the filter retaining member 28 of the frame. In one or more embodiments, the filter module 21 may include roller elements 27 for engagement with roller guides 25 on opposing internal walls of the frame (end portion of the central section 24 and filter retaining member 28). The filter retaining member 28 holds (supports, retains) the filter module 21 in proper position with the filter located adjacent and external to the air inlet of the network device for filtering air entering the network device at the air inlet.

Figure 3:
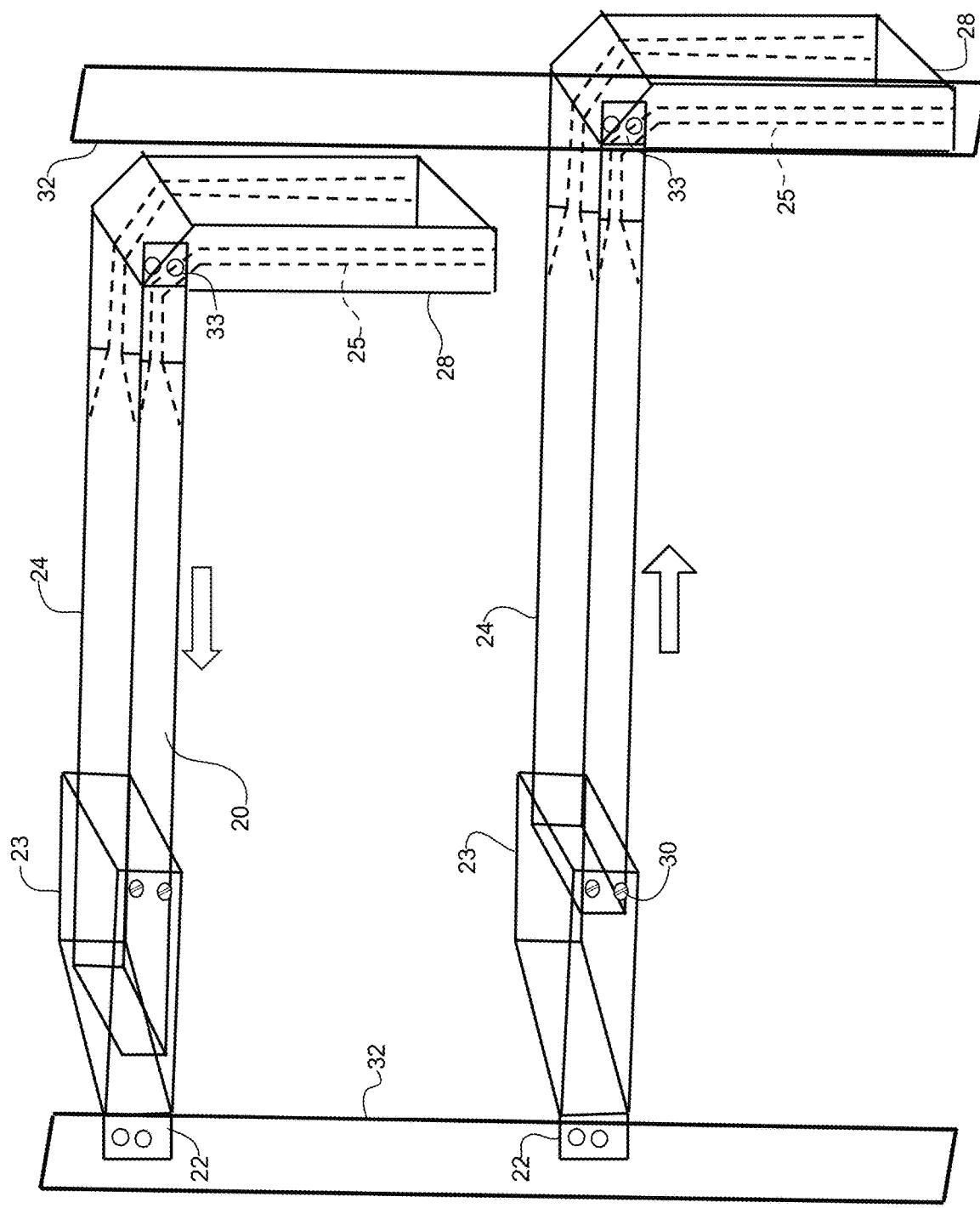
FIG. 3 illustrates the rack mount filter system in a collapsed position for insertion into a rack and an extended position installed in the rack.

As shown in FIG. 2, the mounting section 23 of the frame 20 comprises an opening slightly larger than the external dimensions of the central section 24 for receiving the central section in a telescoping manner, which allows for the width of the frame to be adjusted to insert the frame into an opening (space) between rack posts, as described below with respect to FIG. 3. The mounting section 23 further comprises mounting bracket 22 with openings 31 for receiving fasteners for attaching the frame 20 to the rack post. The central section 24 also includes a mounting bracket 33 for mounting an opposite end of the frame to the other rack post, as shown in FIG. 3. In one example, the width of the frame may be adjustable to fit the frame within a rack with a 19 inch opening. This dimension is only an example and the rack mount filter system may be configured to fit within various size rack systems. The installed width of the frame 20 may also be adjusted with the use of adapter plates that may be attached to the mounting bracket 22.

In the example shown in FIG. 2, the mounting section 23 and mating central section 24 of the frame 20 include a locking system 30 (e.g., thumb screws and corresponding alignment guides) for use in locking the frame in a fixed position after the frame is inserted into the rack and positioned between the rack posts.

FIG. 3 illustrates how the rack mount filter system frame 20 may be collapsed, thereby reducing the width of the frame to allow the frame to fit between two rack posts 32. As previously described, the frame 20 is partially collapsed by sliding the central section 24 of the frame into the mounting section 23 as depicted by the rack mount filter system shown in the upper portion of the rack in FIG. 3. Once the frame 20 is positioned behind the rack posts and the mounting bracket 22 is positioned for attachment to one of the rack posts, the frame 20 may be horizontally expanded by moving the adjustable central section 24 to the right (as viewed in FIG. 3) to align the mounting bracket 33 on the other rack post 32. The frame 20 may then be mounted with suitable fasteners (e.g., screws) inserted into the brackets 22, 33 and the width of the frame 20 locked in place by locking system 30, as shown by the lower installed rack mount filter system in FIG. 3.

It is to be understood that the terms vertical, horizontal, front, rear, right, left, downward, and upward as used herein are only relative terms and that the rack posts may be also positioned horizontally, in which case, the central section 24 of the frame will extend vertically and the filter retaining member 28 will extend horizontally from the central section of the frame. The term front as used herein refers to an exposed or accessible side of the rack system. The opening 26 for receiving the filter is on the front side of the rack system adjacent to the front face of the network device for ease of access.

Figure 4:
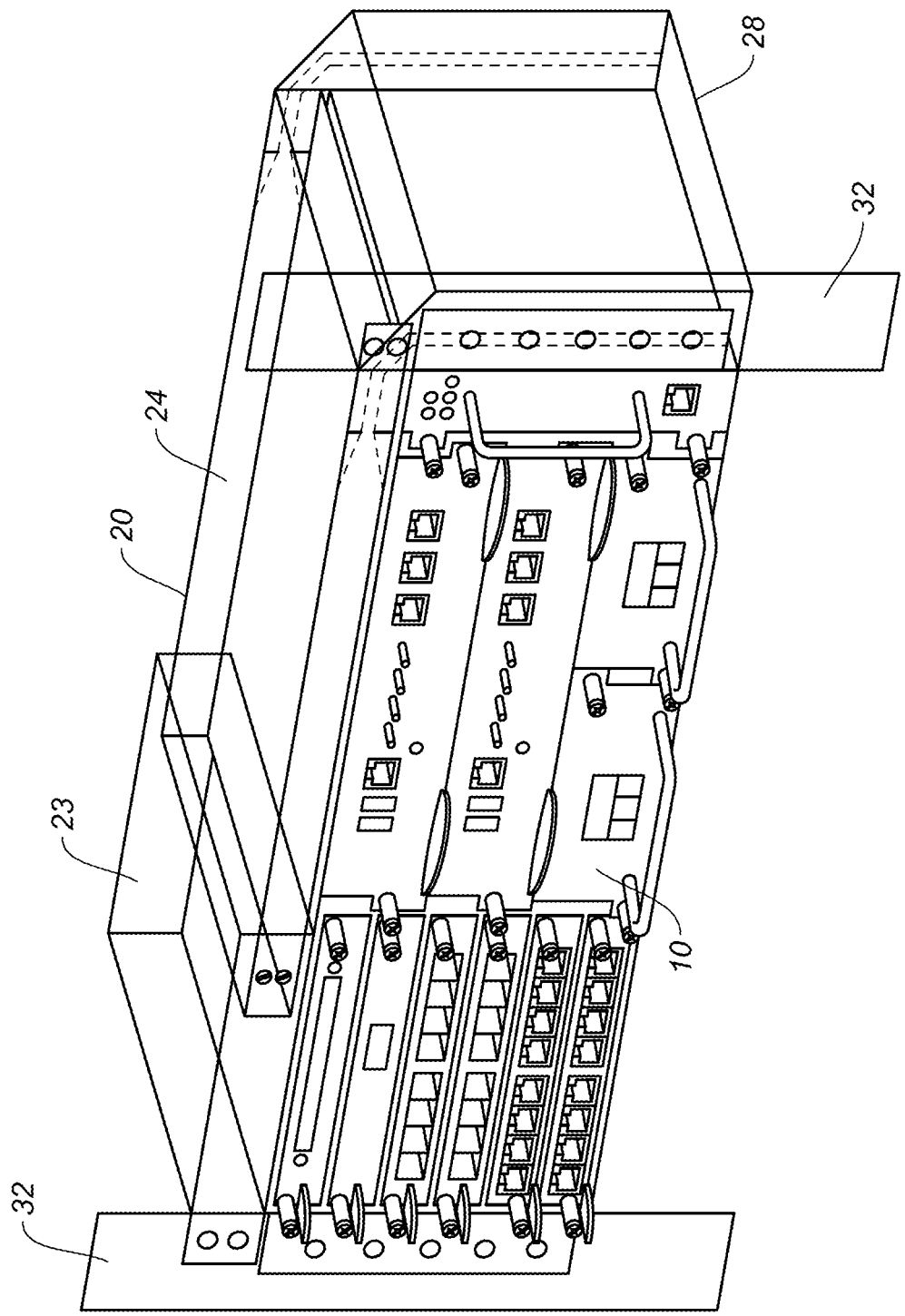
FIG. 4 illustrates the network device of FIG. 1 inserted into the rack with the rack mount filter system.

FIG. 4 shows the network device 10 of FIG. 1 mounted on the rack posts 32 along with the rack mount filter system frame 20. The mounting section 23 and central section 24 are located above the network device 10 and the filter retaining member 28 is positioned adjacent (to the right as shown in FIG. 4) of the network device. The filter retaining member 28 is positioned adjacent to the air inlet of the network device 10 (indicated by arrows 17 in FIG. 1).

It should be noted that if the air inlet is located on the opposite side of the network device, the frame may be configured such that the retaining member 28 is located to the left of the network device, adjacent to the air inlet. In this case, the opening for receiving the filter module would be positioned on the opposite side of the frame to provide access from the front side of the frame.

Figure 5:
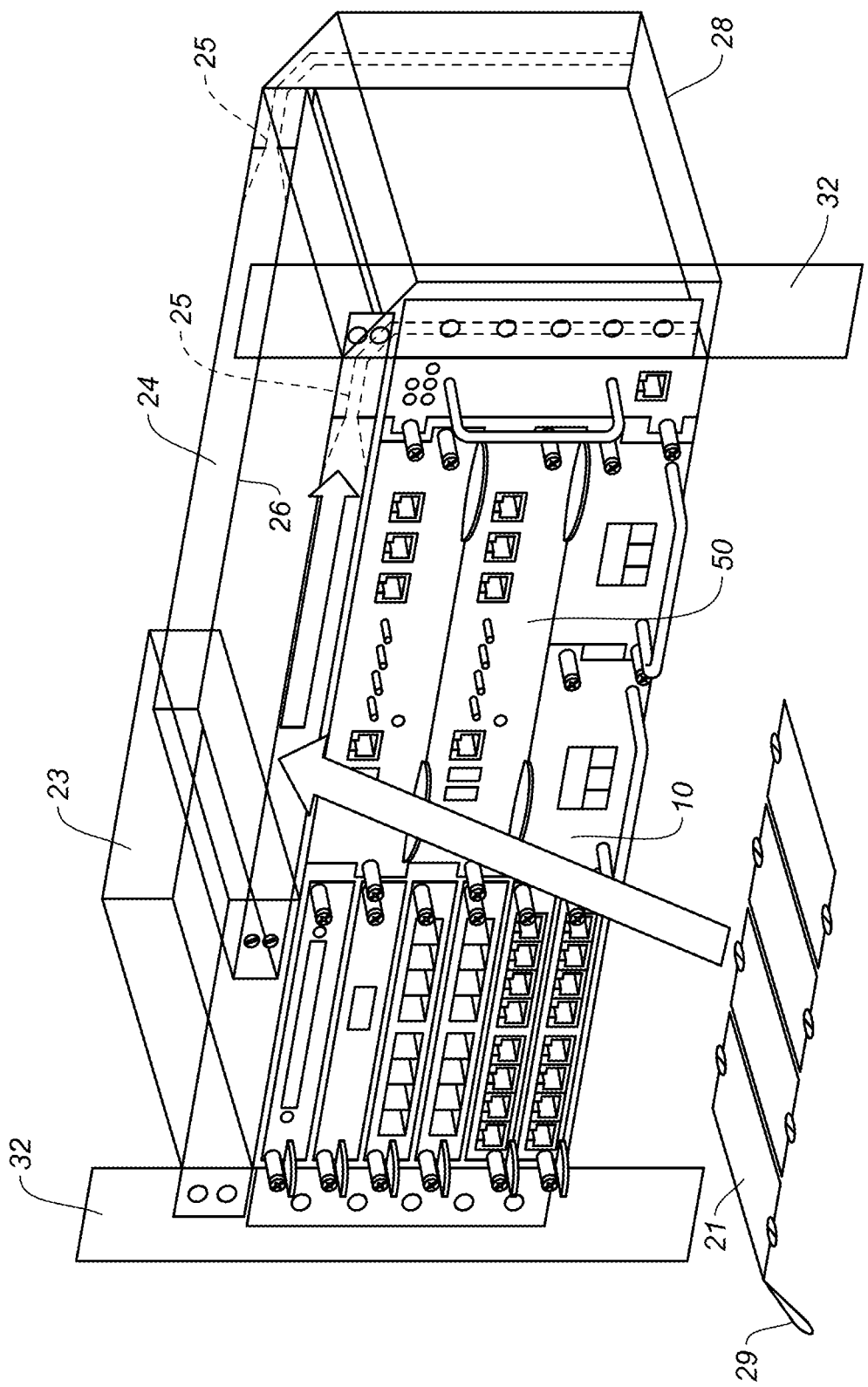
FIG. 5 illustrates insertion of a filter into the rack mount filter system shown in FIG. 4.
Figure 6:
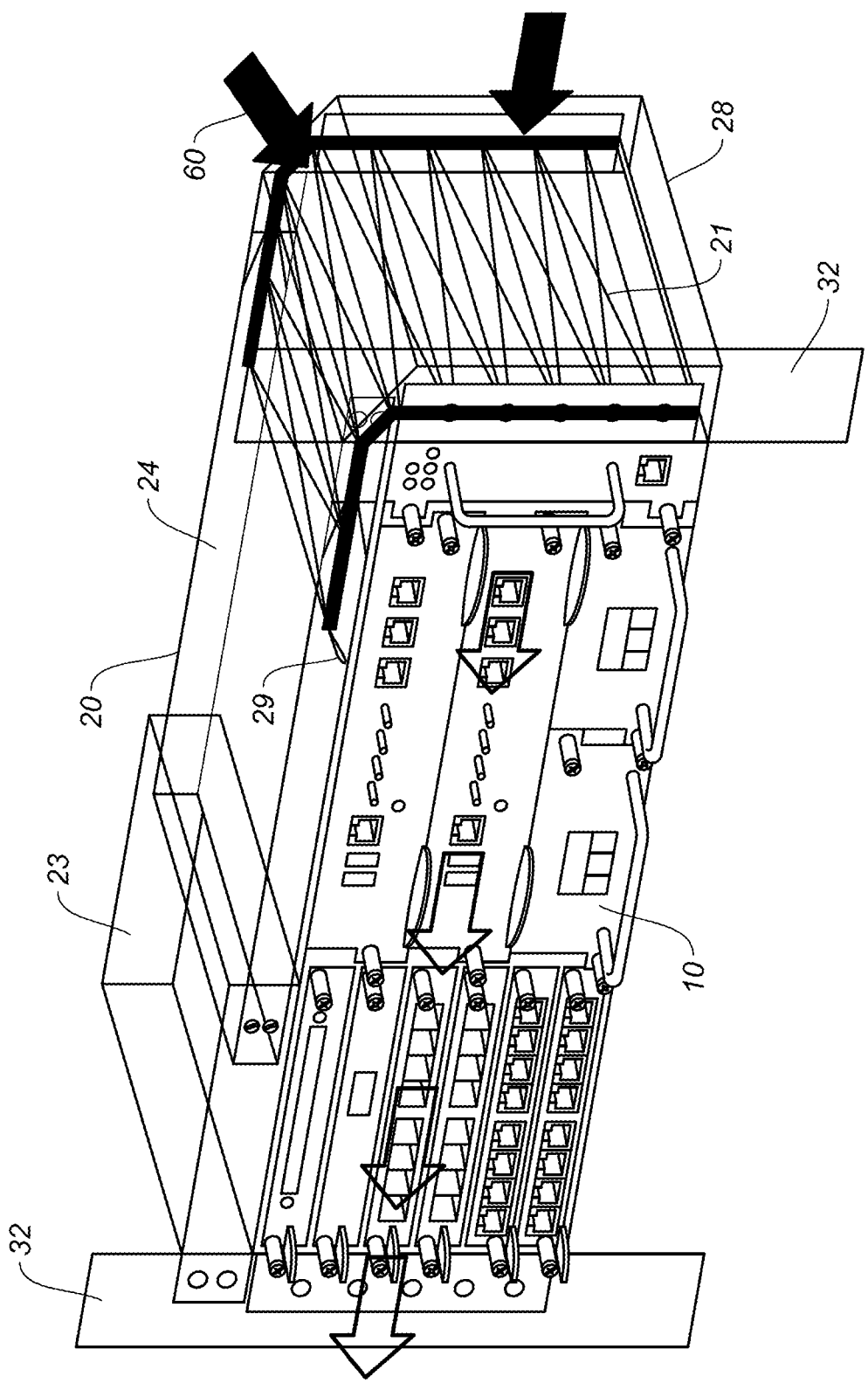
FIG. 6 illustrates the filter installed in the rack mount filter system and air flow through the filter and network device.

FIG. 5 illustrates insertion of the filter module 21 into the front facing opening 26 of the frame, which is located adjacent to the front face 50 of the network device 10. As previously noted, the filter module 21 is independently accessible from the front of the rack. As indicated by arrows on FIG. 5, the filter module 21 is inserted into the opening 26 in the central section 24 of the frame and the handle (lever) 29 may be used to slide the filter module to the right (as viewed in FIG. 5) along the guides 25 within the frame to position the filter within the filter retaining member 28 of the frame and cover the air inlet of the network device, as shown in FIG. 6. The filter module 21 is positioned in the filter retaining member 28 of the frame such that the filter substantially covers openings 11 in the wall of the network device (FIGS. 1 and 6), thereby filtering air entering the network device 10 at its air inlet. Air enters the filter as shown by arrows 60 and the filtered air flows to the left as it is pulled in by the fan, flows through the network device 10 to cool internal components, and exits out the other side of the network device at the air exhaust. The filter module 21 may be easily removed for filter replacement simply by pulling the lever 29 to lift the filter module and slide it to the left and pull the filter module from the opening. The filtration media may then be replaced and the filter module 21 returned to the frame 20 (as described above with respect to FIG. 5).

Figure 7:
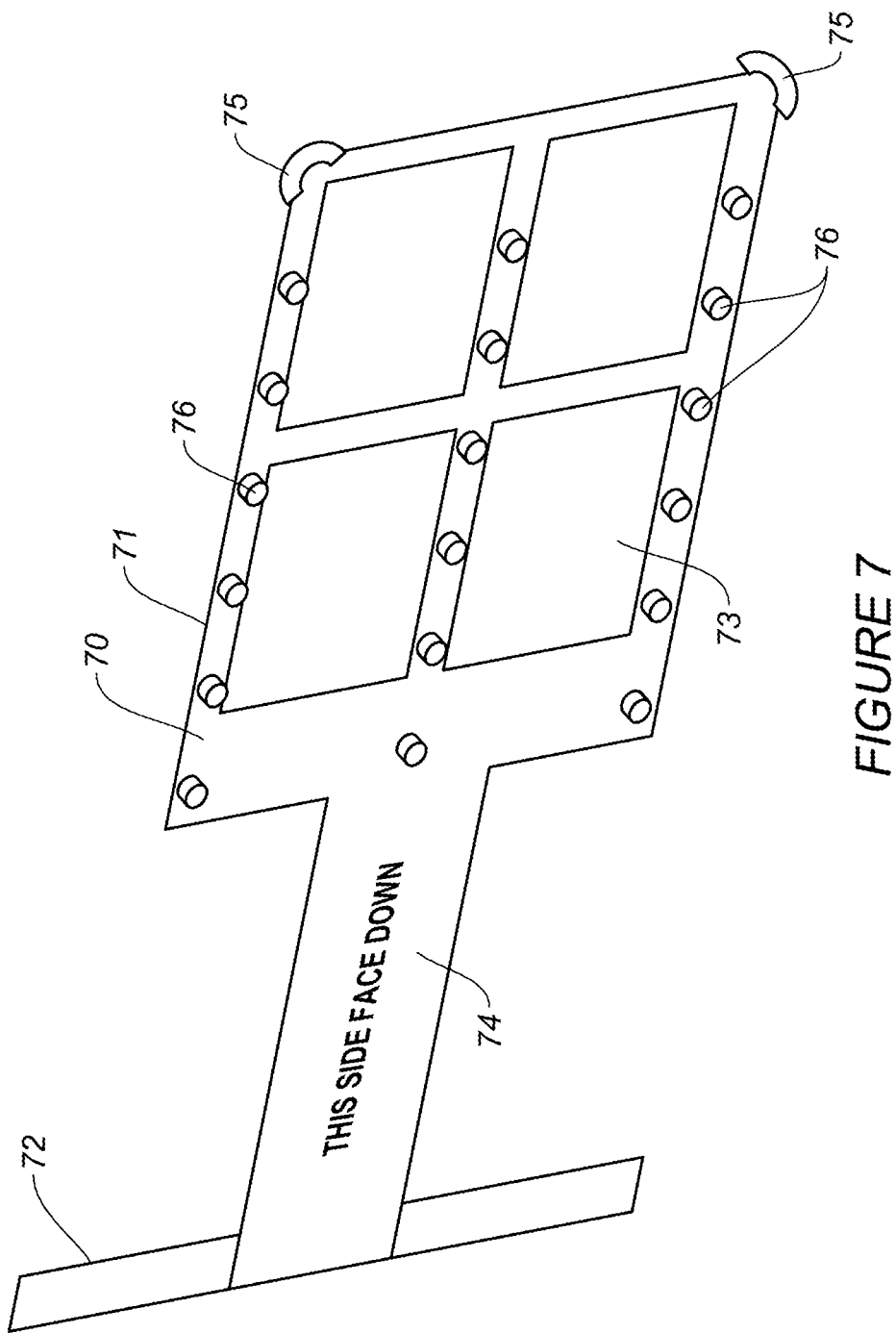
FIG. 7 illustrates an example of a filter module for use in the rack mount filter system shown in FIG. 6.

FIG. 7 illustrates an example of a filter module 70 that may be used in the frame 20 shown in FIG. 6. The filter module 70 includes a flexible filter frame 71 and filtration media 73 inserted into the frame. A handle/lever 72 may be provided for use in guiding the assembly inside the enclosure. An elongated portion 74 connects the main body of the filter module to the handle 72. An indication (e.g., "This Side Face Down") may be provided to identify the correct orientation of the filter module 70 within the rack mount filter system frame. Small sliding elements (e.g., cylindrical or ball shaped members) 76 may be included on the surface of the filter module frame 71 to change contact between the filter module and rack mount filter system frame from surface contact to point contact, thereby reducing sliding friction. The filter frame 71 may also include rounded corners 75 to further ease sliding of the filter module 70 into the rack mount filter system frame. The filter frame 71 may be formed from lubricated plastic or a thin insulation sheet to reduce the weight of the filter assembly, for example.

Figure 8A:
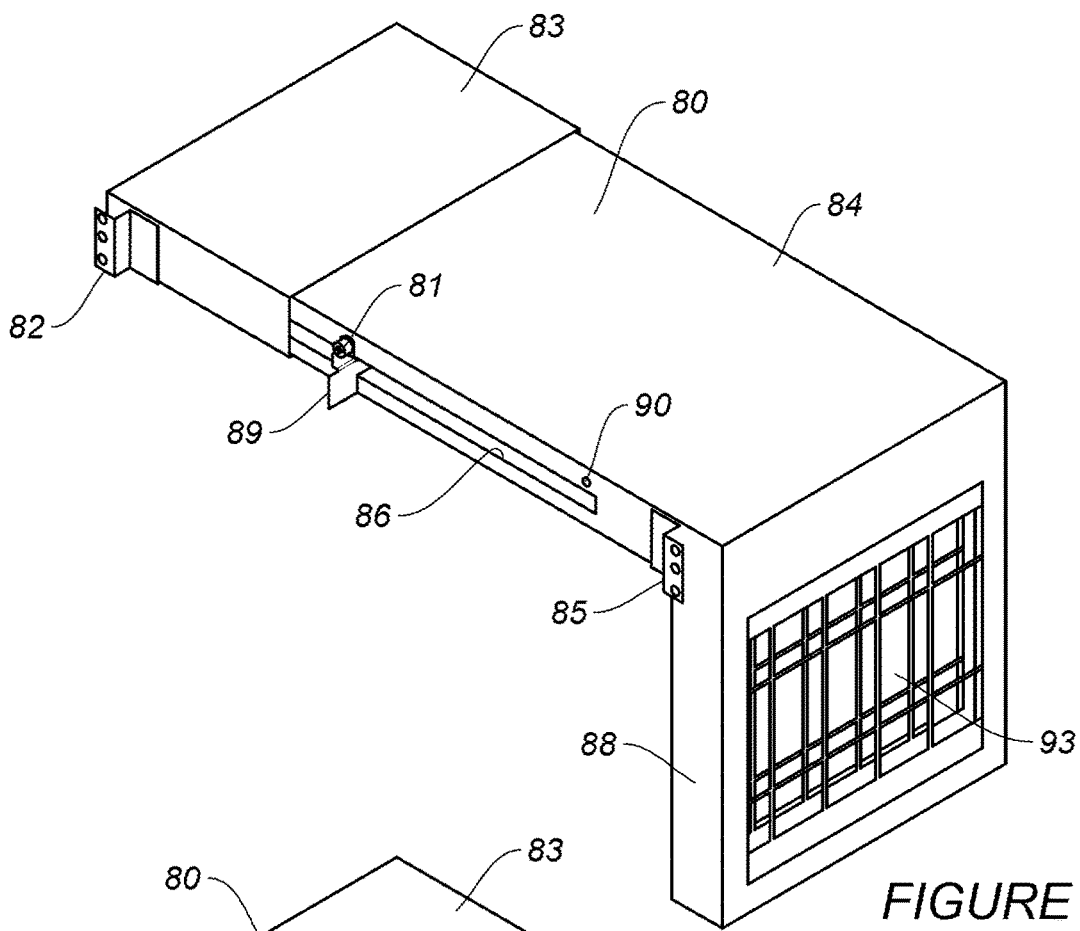
FIG. 8A is a perspective of the rack mount filter system in accordance with one embodiment.
Figure 8B:
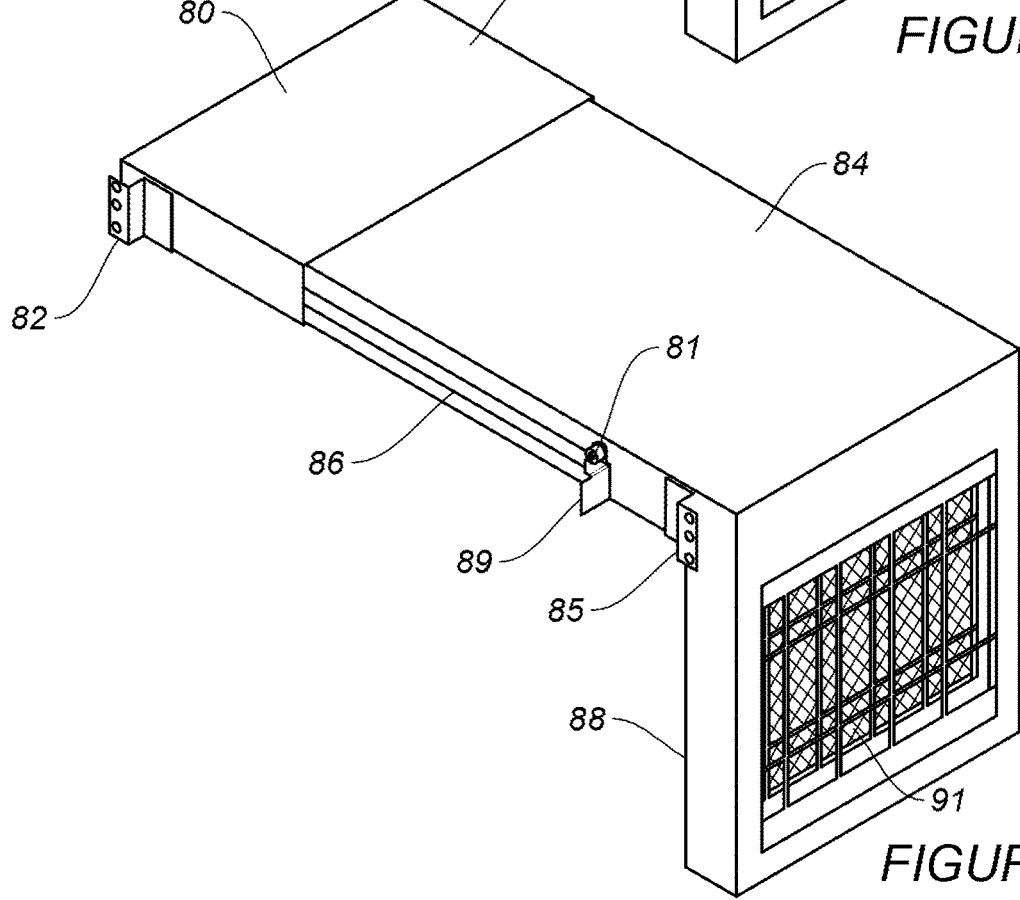
FIG. 8B is a perspective of the rack mount filter system of FIG. 8A with the filter in position for filtering air flow.
Figure 9A:
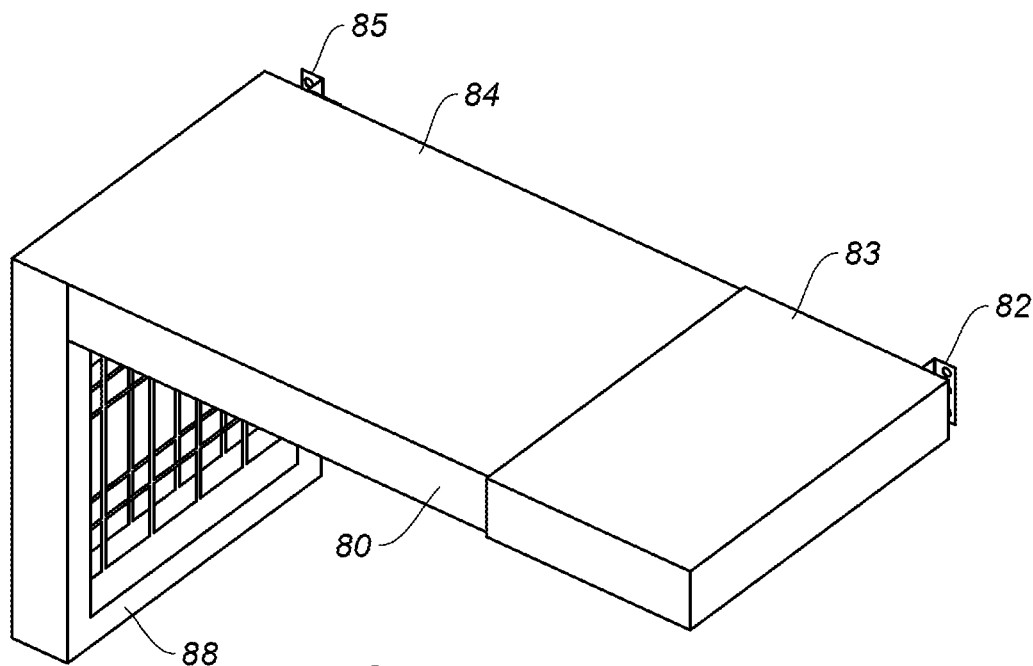
FIG. 9A is a rear perspective of the rack mount filter system of FIG. 8A.
Figure 9B:
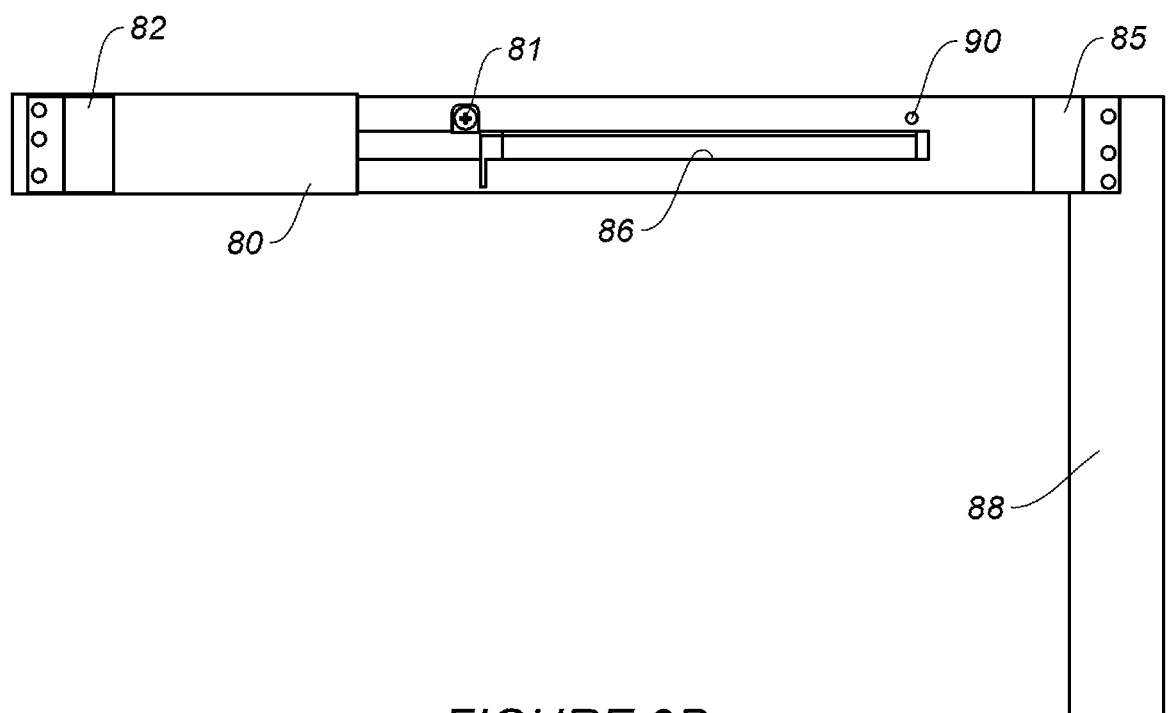
FIG. 9B is a front view of the rack mount filter system of FIG. 8A.

FIGS. 8A and 8B are front perspectives and FIGS. 9A and 9B show a rear perspective and a front view, respectively, of a solid model of a rack mount filter system 80, in accordance with one embodiment. As previously described, the rack mount filter system frame comprises a first portion and a second portion extending generally perpendicular from the first portion. The first portion comprises an adjustable central section 84 slidably receivable in a mounting section 83. The second portion comprises a filter retaining member 88 having air flow vents 93. The central section 84 is slidable within the mounting section 83 to adjust the width of the frame for insertion between the rack posts, as previously described. The mounting section 83 comprises a bracket 82 for mounting the frame to one of the rack posts and the central section comprises a bracket 85 for mounting the frame on the other rack post. The central section 84 includes opening 86 for receiving filter module 91 and positioning the filter externally adjacent to the air inlet of the network device, as previously described.

In FIGS. 8A, 9A and 9B a filter handle 89 is shown positioned at a left side of opening 86, before the filter module has been moved into the filter retaining member 88. FIG. 8B shows the filter module 91 with the filter in its filtering position within the filter retaining member 88 of the frame. The filter handle 89 is moved to the right of the opening 86 against a filter stop at an edge of the opening. In one or more embodiments, a filter lock 81 (e.g., thumb screw) is provided to retain the filter module 91 in its operating position by insertion of the thumb screw into an aligned opening 90 on the frame. The thumb screw 81 may be easily loosened to remove the filter module 91 for replacement of the filtration media.

Figure 10C:
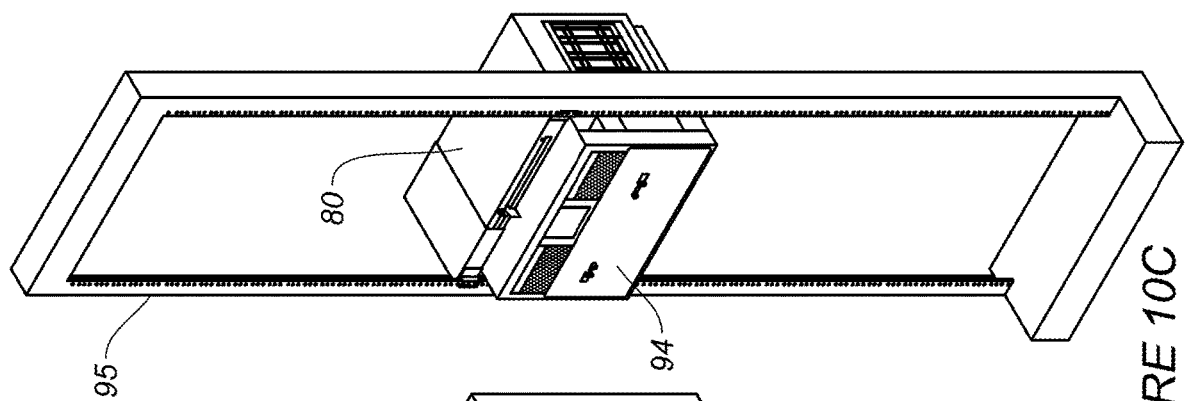
FIG. 10C is a perspective showing the full rack with the network device installed with the rack mount filter system.
Figure 10B:
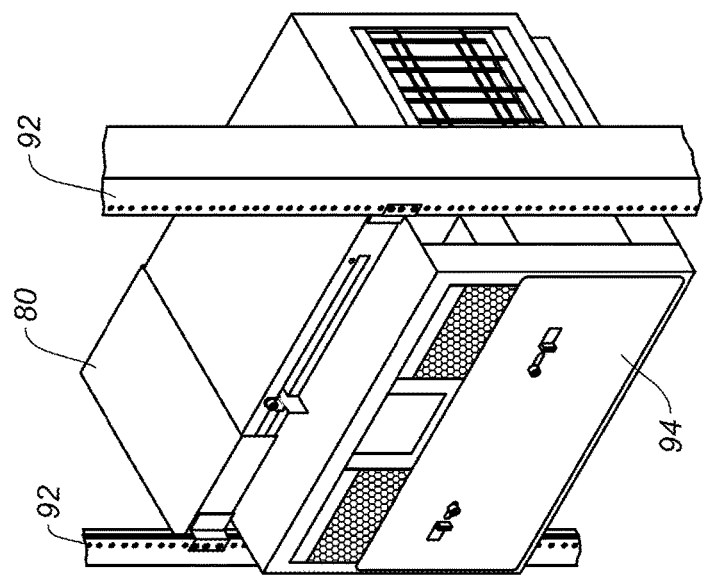
FIG. 10B is a perspective of the network device installed in the rack with the rack mount filter system.
Figure 10A:
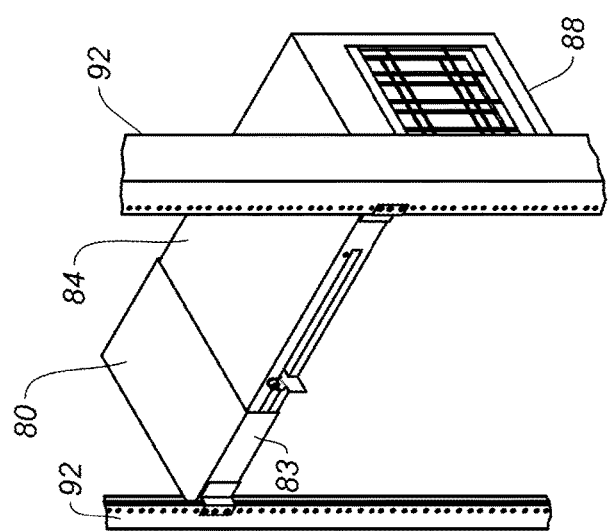
FIG. 10A is a perspective of the rack mount filter system of FIG. 8A installed in a rack.

FIG. 10A shows the rack mount filter system 80 installed on rack posts 92. FIG. 10B shows a network device 94 installed in the rack with the rack mount filter system 80. FIG. 10C shows rack system 95 with the network device 94 and rack mount filter system 80 installed. As shown in FIG. 10C, the rack 95 is configured to hold a plurality of network devices 94 and associated rack mount filter systems 80. It is to be understood that the rack system 95 shown in FIGS. 10A-10C is only an example and that the rack mount filter system described herein may be mounted on different size or configuration racks, without departing from the scope of the embodiments.

Figure 11:
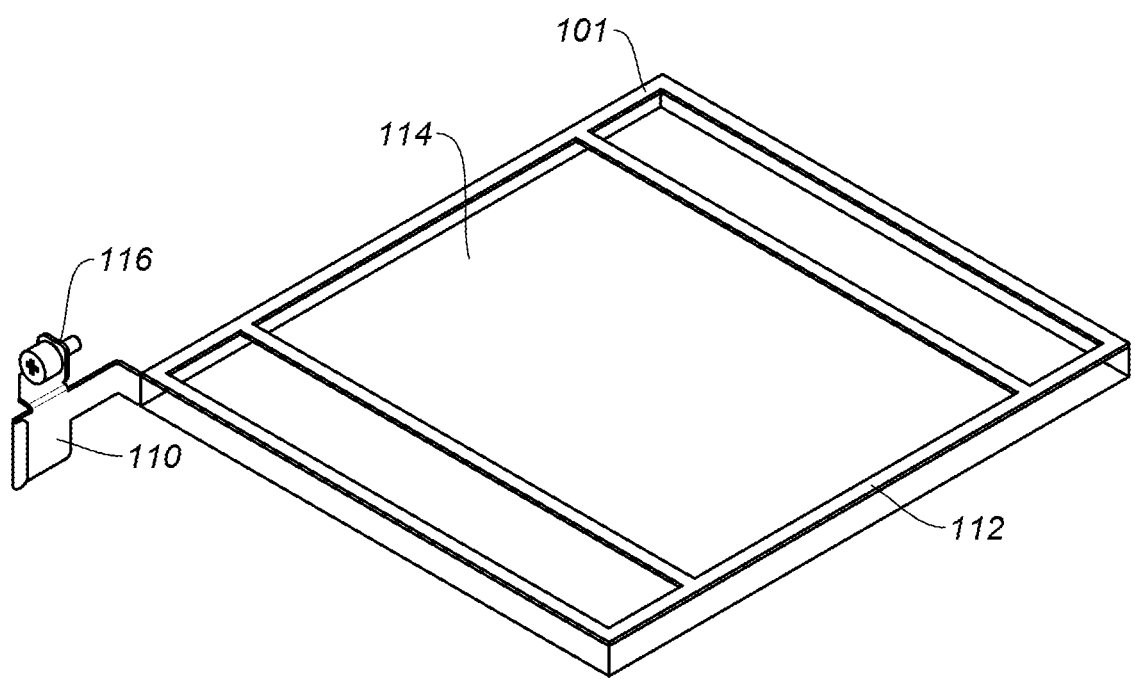
FIG. 11 illustrates an example of a filter module for use in the rack mount filter system of FIG. 8A.

FIG. 11 shows an example of a filter module 101 that may be used in the rack mount filter system 80 shown in FIGS. 8A-10C, in accordance with one embodiment. The filter module 101 comprises a handle 110 connected to a frame 112 configured to support a filter (filtration media) 114. A thumb screw 116 is located above the handle for locking the filter module in place on the frame, as previously described. The filter frame 112 may be formed from a flexible material as described above with respect to FIG. 7 or configured as a hinged frame as described below with respect to FIGS. 12A, 12B, 13A, and 13B.

Figure 12A:
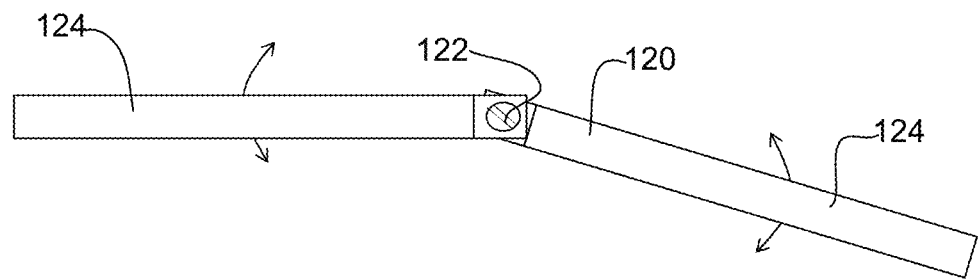
FIGS. 12A and 12B illustrate a hinged filter module, in accordance with one embodiment.
Figure 12B:
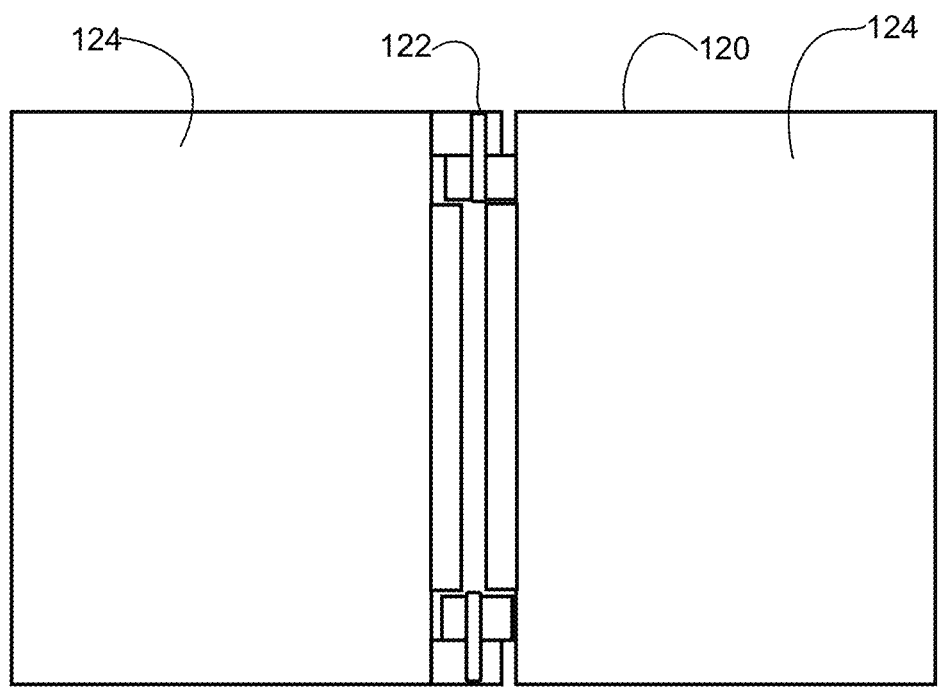

FIGS. 12A and 12B show a side view and top view, respectively, of a hinged (rotatable) filter module 120, in accordance with one embodiment. In this example, the filter module 120 comprises a central hinge 122 and filter frame sections 124 rotatable around the hinge so that a portion of the filter module containing the filter can be moved into the filter retaining member of the rack mount filter system.

Figure 13A:
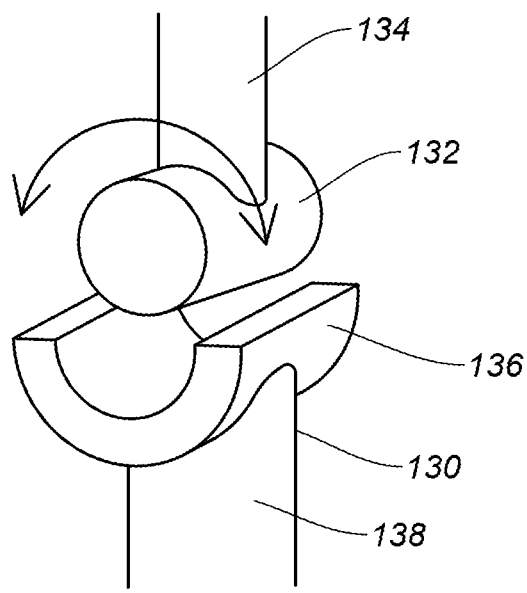
FIGS. 13A and 13B illustrate a hinged filter module, in accordance with another embodiment.
Figure 13B:
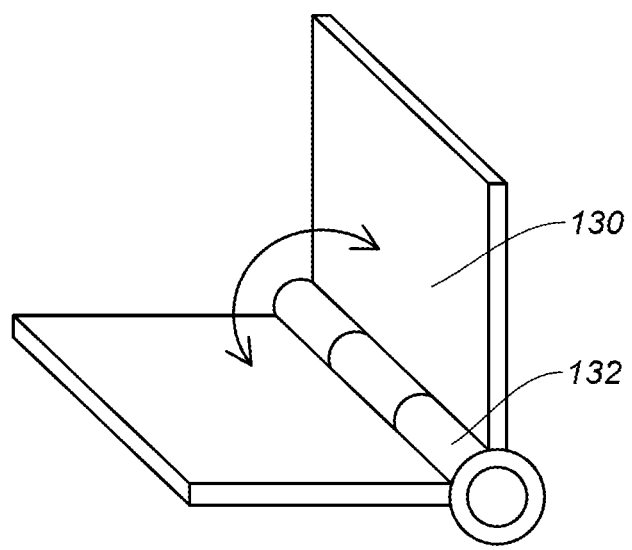

FIGS. 13A and 13B show another example of a hinged filter module 130, in accordance with another embodiment. In this example, the filter comprises a hinge member 132 connected to one section of the frame 134 and rotatable within a U-shaped support member 136, which is connected to another section 138 of the filter frame to allow the filter module to be inserted into the filter retaining member.

Figure 14:
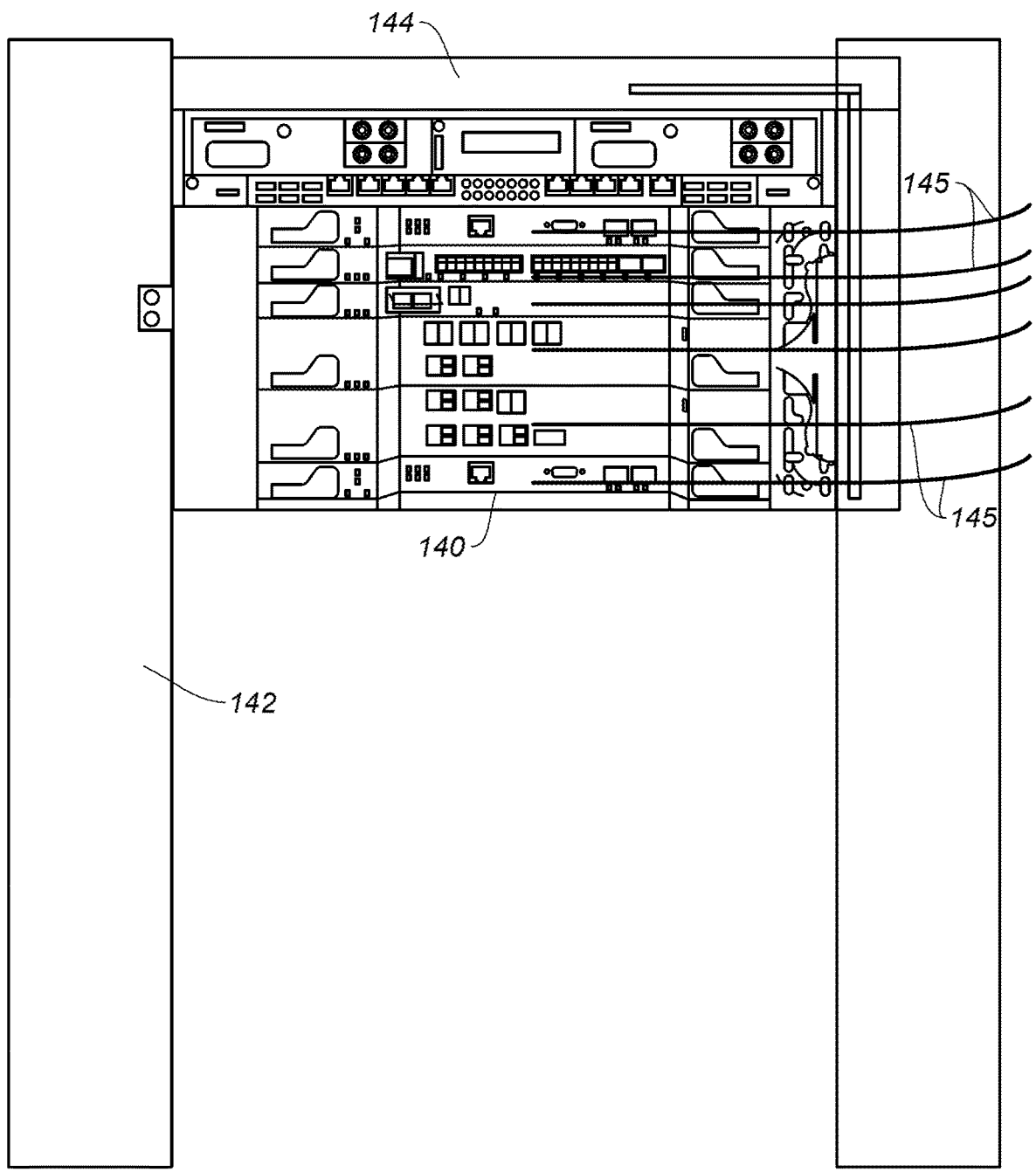
FIG. 14 illustrates the network device installed on the rack with the rack mount filter system and cables installed on the network device.

FIG. 14 is a front view of rack mount filter system 144 installed on a rack (rack system) 142 with a network device 140. As previously described, one or more embodiments may eliminate the need for a filter. Since the network device no longer contains a field replaceable filter unit (previously on the right side of the network device as viewed in FIG. 14), cables 145 may be freely routed along the entire height of the network device, without leaving room to access the filter. Improved cable routing is provided without accessibility issues for field replaceable modules, since the filter is replaced above the network device and the cables can extend along the entire height of the network device 140. The external filter is accessible from the front without any need to move or remove the cables 145.

Figure 15A:
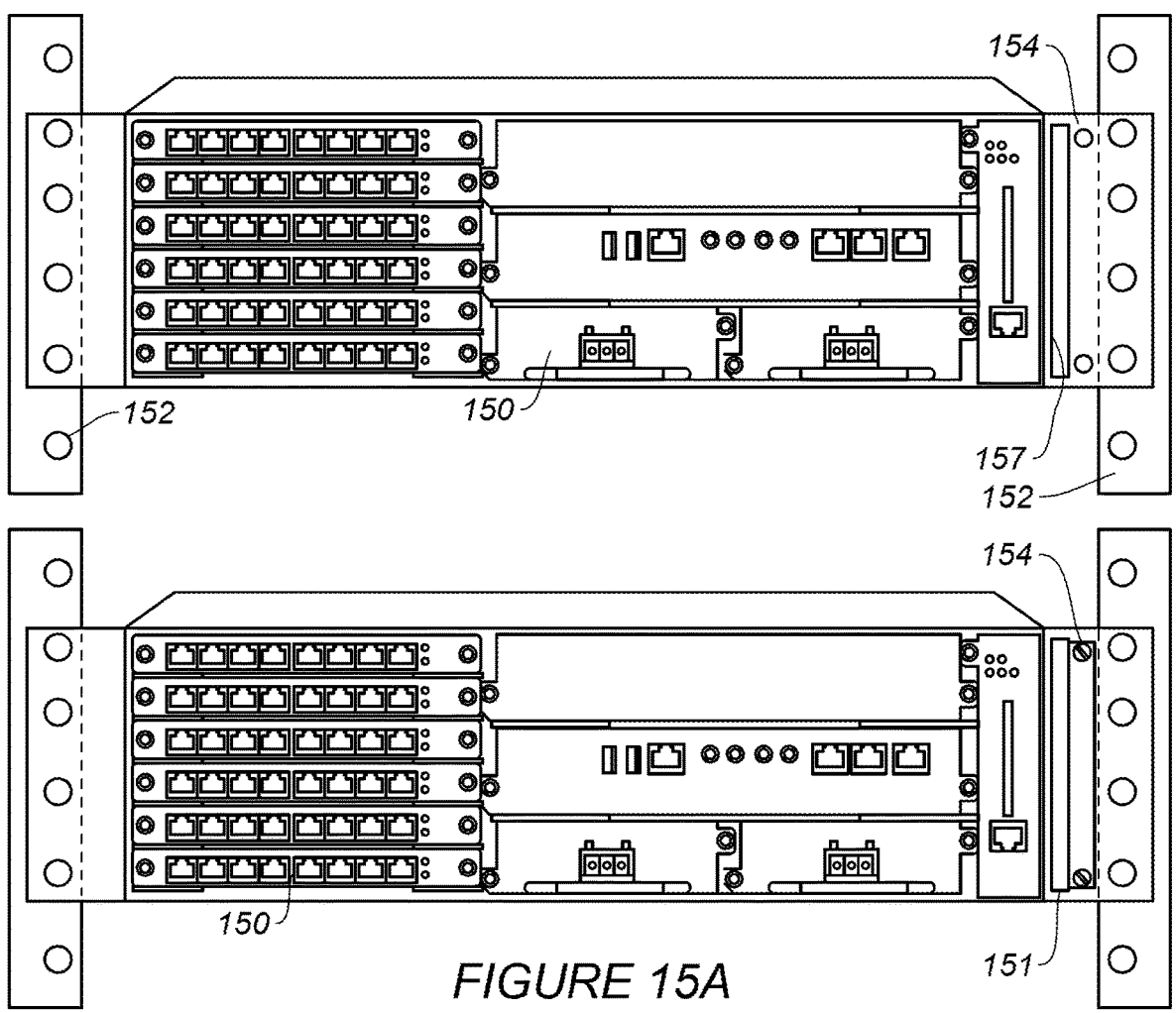
FIG. 15A illustrates another embodiment of the rack mount filter system.
Figure 15B:
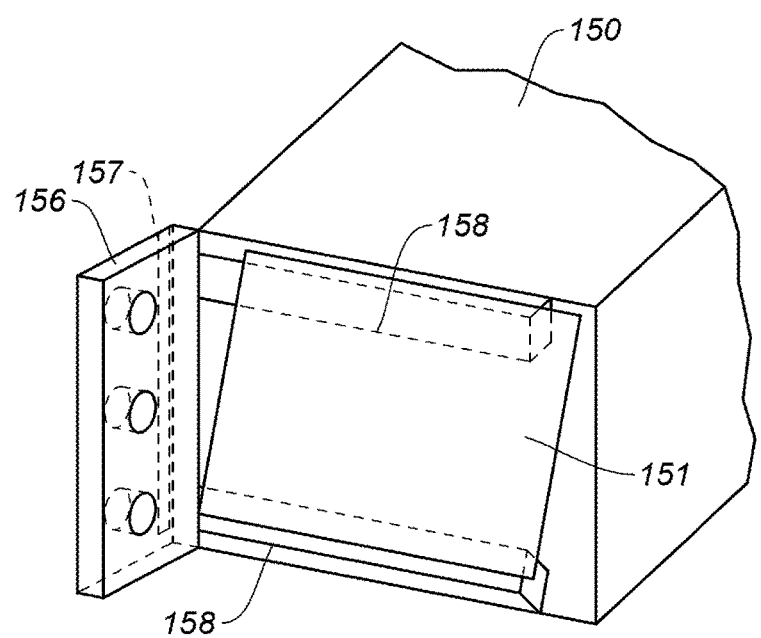
FIG. 15B shows details of the rack mount filter system of FIG. 15A.

FIGS. 15A and 15B show a rack mount filter system 154, in accordance with another embodiment. FIG. 15A is a front view showing two network devices 150 installed on rack posts 152. The top installation shows the rack mount filter system 154 with no filter installed. The bottom installation shows the rack mount filter system with a filter 151 installed. As shown in FIG. 15B, the rack mount filter system comprises a mounting bracket 156 with an opening 157 for receiving the filter 151. Guides 158 extending rearward from the mounting bracket 156 for supporting the filter 151 and aligning the filter with the air inlet on the network device 150. The embodiment shown in FIGS. 15A and 15B may be used on equipment installed on rack systems comprising extra space between the mounting posts after installation of the network device. For example, the rack mount filter system 154 may be used on a 21 inch, 23 inch or any other size rack system. In this example, there is sufficient room for insertion of the filter between the network device 150 and the rack posts 152, due to the difference between the spacing of the rack posts and the width of the network device.

As can be observed from the foregoing, one or more embodiments provide numerous advantages. For example, there is no need to change design of a network device to provide improved air filtration. Existing air filters can be used along with the rack mount filter system or may be removed, thereby providing extra space that can be used for larger, high performance fans for improved cooling. With use of a high performance fan, a higher operating temperature may be supported or a high power line card may be cooled in the same product, providing additional functionality. A user may choose the option based on their deployment needs. Also, additional enclosure area provides increased inlet opening, which compensates for pressure drop.

Furthermore, once the preliminary installation is complete, the filter module is front accessible. There is no need to remove or disturb installation of the network device or cables during filter replacement. The rack mount filter system is easily modified for installation on different size rack systems. Various filter designs may be used to address different contaminants (e.g., dust, moisture, chemical, or any combination thereof). For example, custom chemical filters may be designed to address specific contaminants and may be changed if the type of contaminants present changes over time. During replacement, only the filter needs to be replaced, the frame may be reused. Also, the rack mount filter system frame may be broken down into smaller sections that may telescope into one another for installation over a pre-installed network device.

Although the method and apparatus have been described in accordance with the embodiments shown, one of ordinary skill in the art will readily recognize that there could be variations made to the embodiments without departing from the scope of the embodiments. Accordingly, it is intended that all matter contained in the above description and shown in the accompanying drawings shall be interpreted as illustrative and not in a limiting sense.

What is claimed is:

1. An apparatus comprising:
   a frame for mounting in a rack adjacent and external to a network device supported by the rack; and
   a flexible or hinged filter module for holding a filter for filtering air entering an air inlet of the network device;
   wherein the frame comprises a first portion configured to extend longitudinally between rack posts of the rack and comprising an opening for receiving the filter module and a second portion for positioning the filter adjacent to the air inlet of the network device when installed on the rack with the network device.

2. The apparatus of claim 1 wherein the filter comprises a chemical filter.

3. The apparatus of claim 1 wherein the filter filters dust, moisture and chemicals.

4. The apparatus of claim 1 wherein the network device is an air cooled device comprising an internal fan.

5. The apparatus of claim 1 wherein said second portion of the frame extends generally perpendicular from said first portion of the frame.

6. The apparatus of claim 1 wherein the filter module is movable to said second portion of the frame after insertion into the frame.

7. The apparatus of claim 1 wherein the frame is adjustable to reduce a width of the frame for insertion of the frame into the rack.

8. An apparatus comprising:
   a frame for mounting in a rack in a position adjacent and external to a network device supported by the rack, the frame comprising a first portion for connecting to the rack and a second portion extending from said first portion and positioned adjacent to an air inlet of the network device when the frame is installed in the rack with the network device; and
   a flexible or hinged filter module for holding a filter for filtering air entering the air inlet of the network device;
   wherein said first portion of the frame is configured to extend adjacent to one of an upper surface or a lower surface of the network device and comprises an opening for receiving the filter module and said second portion of the frame positions the filter adjacent to the air inlet of the network device when the frame is installed in the rack with the network device.

9. The apparatus of claim 8 wherein the filter filters one or more of dust, chemicals, and moisture.

10. The apparatus of claim 8 wherein the network device is an air cooled device comprising an internal fan.

11. The apparatus of claim 8 wherein the network device does not comprise an internal air filter.

12. The apparatus of claim 8 wherein said first portion is configured to extend longitudinally between rack posts of the rack and said second portion is configured to extend generally perpendicular to said first portion to hold the filter adjacent to the air inlet of the network device when installed in the rack with the network device.

13. The apparatus of claim 8 wherein said first portion of the frame is adjustable to reduce a width of the frame for insertion in the rack and increase the width for attachment of the frame to the rack.

14. An apparatus comprising:
   a frame comprising mounting brackets for mounting the frame on rack posts of a rack system supporting a network device comprising an air inlet and a fan for cooling internal components of the network device; and a flexible or hinged filter module comprising a filtration media for filtering air at the air inlet of the network device;

wherein the frame comprises an opening for receiving the filter and positions the filter externally adjacent to the air inlet of the network device when mounted on the rack system without attachment to the network device.

15. The apparatus of claim 14 wherein said opening is located adjacent to a front face of the network device when the frame is mounted on the rack system in a position behind a mounting face of the rack posts.

16. The apparatus of claim 14 wherein the network device does not comprise an internal air filter.

17. The apparatus of claim 1 wherein the frame is configured for mounting on the rack without attachment to the network device.

18. The apparatus of claim 8 wherein the filter module is movable to said second portion of the frame after insertion into the frame.

19. The apparatus of claim 14 wherein the frame comprises a first portion configured to extend longitudinally between the rack posts and a second portion configured to extend generally perpendicular to said first portion to hold the filter adjacent to the air inlet of the network device when installed on the rack system with the network device.

20. The apparatus of claim 14 wherein the frame comprises an adjustable width.

* * * * *